US012775027B2

(12) United States Patent
Moluçon et al.

(10) Patent No.: US 12,775,027 B2
(45) Date of Patent: Oct. 27, 2026

(54) OPTICAL FIBRE INTERFEROMETER AND METHOD FOR MEASURING A MAGNETIC FIELD OR AN ELECTRICAL CURRENT BASED ON SAID INTERFEROMETER BY CORRECTING FOR ERRORS AFFECTING SCALING FACTOR

(71) Applicant: EXAIL, Saint-Germain-en-Laye (FR)

(72) Inventors: Cédric Moluçon, Saint-Germain-en-Laye (FR); Thomas Villedieu, Saint-Germain-en-Laye (FR)

(73) Assignee: EXAIL, Saint-Germain-en-Laye (FR)

( * ) Notice: Subject to any disclaimer, the term of this patent is extended or adjusted under 35 U.S.C. 154(b) by 89 days.

(21) Appl. No.: 18/839,668

(22) PCT Filed: Feb. 21, 2023

(86) PCT No.: PCT/EP2023/054324

§ 371 (c)(1),
(2) Date: Aug. 19, 2024

(87) PCT Pub. No.: WO2023/156682

PCT Pub. Date: Aug. 24, 2023

(65) Prior Publication Data

US 2025/0155476 A1 May 15, 2025

(30) Foreign Application Priority Data

Feb. 21, 2022 (FR) ....................................... 2201526

(51) Int. Cl.
*G01R 15/24* (2006.01)
*G01R 33/00* (2006.01)
*G01R 33/032* (2006.01)

(52) U.S. Cl.
CPC ....... *G01R 15/246* (2013.01); *G01R 33/0082* (2013.01); *G01R 33/0322* (2013.01)

(58) Field of Classification Search
CPC .............. G01R 15/246; G01R 33/0082; G01R 33/0322
See application file for complete search history.

(56) References Cited

U.S. PATENT DOCUMENTS 5,644,397 A * 7/1997 Blake ................ G01R 33/0322 356/483
5,987,195 A 11/1999 Blake
(Continued)

FOREIGN PATENT DOCUMENTS

EP 1115000 B1 12/2006

OTHER PUBLICATIONS

J. Blake, et al., "In-Line Sagnac Interferometer Current Sensor", IEEE Transactions on Power Delivery, vol. 11, No. 1, Jan. 1996, pp. 116-121 (6 pages).
(Continued)

*Primary Examiner* — Hwa Andrew Lee
(74) *Attorney, Agent, or Firm* — NIXON & VANDERHYE

(57) ABSTRACT

The invention relates to an optical fiber interferometer comprising a light source (20), a differential phase modulator (16), a signal-processing system (900), a sensing optical fiber (73) having a Verdet constant capable of inducing a non-reciprocal magneto-optic Faraday effect, the interferometer being able to detect a difference in phase of an interferometric beam (300) formed by interference between two polarized light waves (111, 112) that have simultaneously travelled along the optical fiber (73) along a closed optical path, and to deduce therefrom, by means of dividing the phase difference by a scale factor, a value of a magnetic field or a value of an electric current flowing in an electric conductor (120). According to the invention, the signal-processing system (900) is suitable for measuring a variation in power contrast of one portion of the interferometric beam
(Continued)

and to deduce, from the variation in contrast, a measurement of variation of the scale factor.

11 Claims, 5 Drawing Sheets

(56) References Cited

U.S. PATENT DOCUMENTS

| | | | | |
|---|---|---|---|---|
| 2012/0283969 | A1 | 11/2012 | Bohnert et al. | |
| 2016/0033556 | A1* | 2/2016 | Mueller ............... | G01R 15/246<br>324/96 |
| 2018/0238934 | A1* | 8/2018 | Bohnert ............... | G01R 15/247 |

OTHER PUBLICATIONS

Klaus Bohnert, et al., “Highly Accurate Fiber-Optic DC Current Sensor for the Electro-Winning Industry”, IEEE, 2005, pp. 121-128 (8 pages).

Hervé C. Lefèvre, “The fiber optic gyroscope”, Second Edition, Artech House, Figure 7.1-a, Exhibit C-32, 2014, 6 pages.

International Search Report for PCT/EP2023/054324 dated May 11, 2023, 5 pages.

* cited by examiner

OPTICAL FIBRE INTERFEROMETER AND METHOD FOR MEASURING A MAGNETIC FIELD OR AN ELECTRICAL CURRENT BASED ON SAID INTERFEROMETER BY CORRECTING FOR ERRORS AFFECTING SCALING FACTOR

CROSS-REFERENCE TO RELATED APPLICATIONS

This application is the U.S. national phase of International Application No. PCT/EP2023/054324 filed Feb. 21, 2023 which designated the U.S. and claims priority to FR Patent Application No. 2201526 filed Feb. 21, 2022, the entire contents of each of which are hereby incorporated by reference.

TECHNICAL FIELD

The present invention generally relates to the field of sensors based on a fiber-optic interferometer. More particularly, it relates to a sensor using the magneto-optic Faraday effect to integrate a magnetic field along a closed optical path in an optical fiber.

Such a sensor finds in particular applications as a fiber-optic current sensor (or FOCS), in which the optical fiber surrounds an electric conductor or also as a magnetic field sensor.

More particularly, it relates to a sensor and a method for high-accuracy electric current measurement, corrected for errors affecting the scaling factor.

PRIOR ART

In the above-mentioned field, the publication J. Blake et al. "In-Line Sagnac Interferometer Current Sensor", IEEE Transactions on Power Delivery, Vol. 11, no 1, pages 116-121, 1996, describes a reflection (or in-line) fiber-optic interferometer used as an electric current sensor via the magnetic field induced.

The publication "Highly accurate fiber-optic DC current sensor for the electro-winning industry", K. Bohnert, H. Brändle, M. Brunzel, P. Gabus and P. Guggenbach, IEEE, PCIC-2005-14, pp. 121-128 also describes a current sensor based on a fiber-optic interferometer for measuring the Faraday effect induced in a detection optical fiber. According to this publication, the current sensor may be based on a Sagnac fiber-optic interferometer or reflection fiber-optic interferometer configuration. The detection optical fiber is arranged in such a way as to form at least one turn around the periphery of an electric cable through which flows an electric current, the intensity of which is to be measured. The detection fiber is generally of the circular polarization-maintaining type. In the case of a Sagnac interferometer, a phase difference is measured between two waves that have travelled through the detection optical fiber with a same circular polarization state, and in mutually opposite directions. In the case of a reflection fiber-optic interferometer, a phase difference is measured between two waves that have travelled back and forth together through the detection optical fiber, with circular polarization states that are orthogonal to each other, these states being reversed between the forward and return paths upon reflection on the mirror. At rest, i.e. here in the absence of electric current or magnetic field, the optical paths along which the two waves travel are perfectly identical due to the reciprocity of propagation of the waves in opposite directions; the two paths are besides said to be perfectly reciprocal.

An electric current flowing through an electric conductor induces a magnetic field. This magnetic field generates in the detection optical fiber a Faraday effect, or non-reciprocal collinear magneto-optic effect. More precisely, the Faraday effect is the rotatory effect of optical polarization produced by a magnetic field. Therefore, the polarization plane of a linear-polarization light beam passing through a material, for example silica, placed in a magnetic field B and propagating parallel to this field, rotates by a rotation angle β that depends on the Verdet constant of the material of the detection optical fiber, denoted V, of the magnetic field B and the length, d, of the optical path in the passed-through material. The rotation angle β of the polarization is proportional to the circulation of the magnetic field B along the detection optical fiber. The rotation angle of the polarization depends on the magnetic field direction and also on the direction of propagation of light (see also "The fiber optic gyroscope", second edition, Hervé Lefèvre, Artech House, FIG. 7.1-a, page 107). This rotation by an angle β of the linear polarization is interpreted as a circular birefringence. Indeed, the linear polarization may be decomposed into two opposite (right-handed and left-handed) circular polarizations. By Faraday effect, these two circular polarizations, propagating in the same direction, undergo a phase difference that is observed by a rotation of the linear polarization that is the combination of these two co-propagating circular polarizations.

In the case of a current sensor based on a Sagnac interferometer, the two waves propagate in opposite directions, and with the same circular polarization. The Faraday effect does not change this circular polarization, but a phase difference is created between the two waves propagating in opposite directions (see also "The fiber optic gyroscope", second edition, Hervé Lefèvre, Artech House, FIG. 7.1-b, page 107). This phase difference $\Delta\Phi_s$ is measured after recombination of the two waves at the output of the interferometer, and is equal to:

$$\Delta\Phi_S = 2VNI$$

where V represents the Verdet constant of the core material of the detection optical fiber, N the integer number of optical fiber turns wound about the electric conductor and/the intensity of the electric current flowing through the electric conductor.

In the case of a current sensor based on a reflection fiber-optic interferometer, the measured phase difference $\Delta\Phi_R$ is proportional to:

$$\Delta\Phi_R = 4VNI$$

In the case of a reflection fiber-optic interferometer, the scaling factor is double (4 V N I instead of 2 V N I) by comparison with a Sagnac interferometer, due to the fact that the polarized waves each make a round trip in the detection optical fiber. Moreover, a reflection fiber-optic interferometer is rather less sensitive than a loop interferometer to the interferometer's rotation speed, to the vibrations and to the thermal effects.

Such fiber-optic sensors have many advantages. They enable contactless magnetic field or electric current measurement, with an accuracy of the order of 1%. They enable current measurements over an extended dynamic range, for example between a minimum value of detectable current of the order of a few micro-amperes and a maximum value of detectable current of the order of a few thousands of amperes. Finally, they are insensitive to many environmental factors.

However, it is desirable to improve the accuracy of the sensors based on a fiber-optic interferometer and in particular the scaling factor, which defines the linearity of the sensor response as a function of the signal detected, i.e. of the phase difference measured. A measurement accuracy better than 0.1% or even 0.01% is desirable.

However, these fiber-optic interferometers are sensitive to other undesirable effects. These undesirable defects are liable to impact the scaling factor.

On the one hand, the scaling factor of a fiber-optic interferometer can have a building defect, for example due to a misalignment of an optical component. In particular, in the case where a quarter-wave plate is used to transform a linear polarization wave into a circular polarization wave, this plate can have an effective phase difference that is different of the theoretical phase difference of $\pi/2$ of a quarter-wave plate and/or show a misalignment of its eigen-axes with respect to the incident linear polarization.

On the other hand, the scaling factor of a fiber-optic interferometer may vary over time. In particular, it is known that the Verdet constant of the fiber depends on the temperature and the wavelength of the beam. The scaling factor may show variations due to variations of the Verdet constant of the optical fiber, induced for example by variations of temperature at the sensitive part of the sensor. The scaling factor can also vary due to temperature variations at the optical differential phase modulator.

Finally, other disturbances may affect the interferometric measurements, such as, for example, light power variations of the source.

One of the objects of the invention is to propose an electric current or magnetic field sensor based on a fiber-optic interferometer making it possible to measure in real time a scaling factor variation or defect, whatever the origin of this variation or defect. Another object of the invention is to make it possible to correct in real time this scaling factor error in such a sensor.

SUMMARY OF THE INVENTION

In order to remedy the above-mentioned drawbacks of the state of the art, the present disclosure proposes a fiber-optic interferometer comprising a light source adapted to generate a source beam, a differential phase modulator, a fiber-optic device, a detection system, a signal-processing system, the fiber-optic system comprising a detection optical fiber having a Verdet constant capable of inducing a non-reciprocal magneto-optic effect Faraday effect, the detection optical fiber being arranged in a magnetic field or forming at least one turn around an electric conductor, the fiber-optic interferometer being capable of detecting a phase difference of an interferometric beam formed by interferences between two polarized light waves having travelled simultaneously through the detection optical fiber along a closed optical path, the two polarized light waves being modulated by the differential phase modulator, and the fiber-optic interferometer being capable of deducing therefrom, by dividing the phase difference by a scaling factor, a value of the magnetic field integrated along the closed optical path or a value of an electric current flowing in the electric conductor, the scaling factor being proportional to the Verdet constant of the optical fiber.

According to the invention, the signal-processing system is adapted and configured to measure a variation of power contrast of part of the interferometric beam modulated by the differential phase modulator and to deduce from the contrast variation a measurement of variation of the scaling factor.

According to a particular aspect, the signal-processing system is adapted and configured to measure a power minimum of the part of the detected modulated interferometric beam and/or a difference between a power maximum and minimum of the part of the detected modulated interferometric beam.

According to another particular and advantageous aspect, the signal-processing system is adapted and configured to correct in real time the scaling factor as a function of the measurement of variation of this scaling factor.

In the first and second embodiment, the detection optical fiber is of the circular polarization-maintaining type, the fiber-optic device comprising an optical phase retarder and a reflector, the optical phase retarder being arranged at one end of the detection optical fiber and the reflector at an other end of the detection optical fiber, the interferometer being configured in such a way that the two polarized light waves travel back and forth through the detection optical fiber, with two orthogonal states of circular polarization, which are reversed by reflection on the reflector.

According to one aspect of the first embodiment, the differential phase modulator is an electro-optical birefringence modulator that comprises a single waveguide capable of guiding two orthogonal states of linear polarization along two perpendicular axes; the birefringence modulator differentially modulating the phases of the two orthogonal linear polarizations. The interferometer also includes a polarizer arranged between the light source and the electro-optical birefringence modulator, the polarizer being oriented at 45 degrees with respect to the axes of the electro-optical birefringence modulator, and one end of the electro-optical birefringence modulator being connected to the fiber-optic device.

According to an aspect of the second embodiment, the interferometer comprises a Y-junction separator arranged between the light source and the differential phase modulator comprising two waveguides capable of guiding two beams of same linear polarization and each comprising a phase modulator preferably connected in push-pull configuration, i.e. with an opposite sign. The fiber-optic device includes a polarization-maintaining optical fiber section and an other polarization-maintaining optical fiber section, the optical fiber section and, respectively, the other optical fiber section being each connected, on the one hand, to one of the two waveguides of the differential phase modulator and, on the other hand, to a polarization coupler-splitter, the other optical fiber section being oriented so as to rotate a linear polarization by 90 degrees.

According to a third embodiment, the detection optical fiber is of the circular polarization-maintaining type, the fiber-optic device comprises a Y-junction separator arranged between the light source and the differential phase modulator, which comprises two waveguides capable of guiding two beams of same linear polarization and each comprising a phase modulator preferably connected in push-pull configuration, i.e. with an opposite sign. The fiber-optic device includes a polarization-maintaining optical fiber section, an optical phase retarder, an other polarization-maintaining optical fiber section, and an other optical phase retarder, the optical fiber section and, respectively, the other optical fiber section being each connected, on the one hand, to one of the two waveguides of the differential phase modulator, and on the other hand, to the optical phase retarder, respectively to the other optical phase retarder, the optical phase retarder being arranged at one end of the detection optical fiber and the other optical phase retarder being arranged at an other end of the detection optical fiber, the interferometer being configured in such a way that the two polarized light waves travel through the detection optical fiber in opposite directions with a same circular polarization state.

According to a particular and advantageous aspect of any one of these embodiments, the optical phase retarder, and/or respectively the other optical phase retarder, each form a quarter-wave plate at the wavelength of the source beam.

Advantageously, the optical phase retarder and/or respectively the other optical phase retarder is offset in such a way as to introduce a defect, and the signal-processing system is adapted to extract from the detected interferometric signal a measurement of variation of the scaling factor of the system and thus to deduce therefrom a temperature variation of the optical phase retarder, respectively of the other optical phase retarder.

The invention also relates to a method for measuring a magnetic field or an electric current based on a fiber-optic interferometer according to one of the described embodiments, the method comprising the following steps: emission of a source beam from a light source; splitting of the source beam into two polarized light waves; differential phase modulation of the two polarized light waves; transmission of the two polarized light waves to a fiber-optic device comprising an optical fiber so that the two polarized light waves travel simultaneously through the optical fiber along a closed optical path, the optical fiber having a Verdet constant capable of inducing a non-reciprocal magneto-optic Faraday effect, the detection optical fiber being arranged in a magnetic field or forming at least one turn about an electric conductor; recombination of two polarized light waves at the output of the fiber-optic device to form an interferometric beam; detection of the interferometric beam; and processing of the detected signal to extract a measurement of a phase difference of the interferometric beam and to deduce therefrom, by dividing the phase difference by a scaling factor, a value of the magnetic field integrated along the closed optical path or a value of an electric current flowing in the electric conductor.

According to the present disclosure, the signal processing is adapted and configured to measure a variation of power contrast of part of the interferometric beam modulated by the differential phase modulator and to deduce from the contrast variation a measurement of variation of the scaling factor.

Obviously, the different features, alternatives and embodiments of the invention can be associated with each other according to various combinations, insofar as they are not incompatible or exclusive with respect to each other.

BRIEF DESCRIPTION OF DRAWINGS

Moreover, various other features of the invention emerge from the appended description made with reference to the drawings that illustrate non-limiting embodiments of the invention, and wherein.

Figure 1:
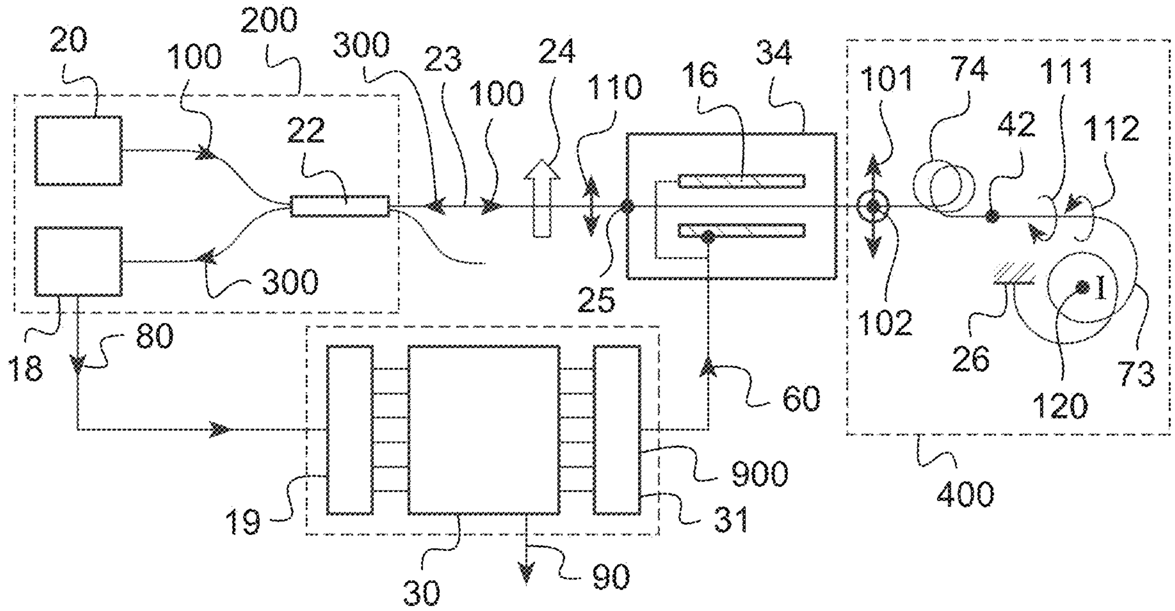
FIG. 1 illustrates a first embodiment of an electric current or magnetic field sensor based on a reflection fiber-optic interferometer.

It is to be noted that, in these figures, the structural and/or functional elements common to the different alternatives can have the same references numbers.

DETAILED DESCRIPTION OF THE INVENTION

The main elements of an electric current or magnetic field sensor based on a fiber-optic interferometer will now be described in relation with FIGS. 1 to 3. The differences between the first embodiment illustrated in FIG. 1, the second embodiment illustrated in FIG. 2 and the third embodiment illustrated in FIG. 3 will be described in detail hereinafter.

Generally, an electric current sensor based on a fiber-optic interferometer includes a source-detector block 200, a polarizer 24, an electro-optical differential phase modulator 16, a fiber-optic device 400 forming a closed optical path to surround an electric conductor 120, a signal-processing system 900 and a system of interfaces (not shown). In the following of the present document, the electro-optical differential phase modulator 16 is also called optical differential phase modulator, differential phase modulator or optical modulator.

The source-detector block 200 comprises a light source 20, a detection system 18 and a source-receiver splitter 22, called receiver splitter. All the electric and electronic components, whether they are analog or digital, may be included in a casing.

The polarizer 24 and the optical modulator 16 are arranged in series between the source-detector block 200 and the fiber-optic device 400.

The fiber-optic device 400 comprises a detection optical fiber 73 capable of forming at least one turn around the electric conductor 120. The detection optical fiber 73 is used as a fiber sensitive to a magneto-optic effect. For that purpose, the detection optical fiber 73 is chosen to have a Verdet constant, V. For example, the detection optical fiber 73 has a silica core, which has a Verdet constant of the order of about 0.6 rad $T^{-1}$ $m^{-1}$ at the wavelength of 1550 nm for silica. Advantageously, the detection optical fiber 73 is a polarization-maintaining fiber twisted at the fiber draw, also called SPUN fiber. Such a SPUN fiber makes it possible to keep the circular polarization of light. As an alternative, the detection optical fiber 73 is of the linear polarization-maintaining type. However, such configuration is far less efficient.

The light source 20 generates a light beam 100. The source-receiver splitter 22 transmits the source beam 100, for example via an optical fiber section 23, to the polarizer 24. The polarizer 24 receives the source beam and transmits a linearly polarized source beam 110 to the optical modulator 16.

FIG. 1 schematically shows a current sensor based on a fiber-optic interferometer according to a first embodiment. The polarizer 24 and the electro-optical differential phase modulator 16 are arranged and configured to receive the linearly polarized source beam 110 and to split it into two waves 101, 102 linearly polarized along two orthogonal polarization states. More precisely, a polarization splitter is formed by orienting the eigen-axes of the polarizer 24 at 45 degrees from the eigen-axes of the electro-optical differential phase modulator 16. The electro-optical differential phase modulator 16 is for example consisted of an electro-optical modulator integrated on a lithium niobate substrate and formed for example by diffusion of titanium. The integrated optical circuit 34 includes a single waveguide formed for example by diffusion of titanium in a lithium niobate substrate. The waveguide advantageously makes it possible to guide the two transverse linear polarization states. The electrodes of the phase modulator 16 are arranged along the sides of the waveguide. The waveguide of the integrated optical circuit 34 is birefringent. The combination of the polarizer 24 and the electro-optical differential phase modulator 16 thus enables the linearly polarized source beam 110 to be polarization split into a first polarized single-mode wave 101 and a second orthogonally polarized wave 102, which propagate on the same single-mode waveguide of the electro-optical differential phase modulator 16. For example, in the following, the first linearly TE-polarized single-mode wave 101 and the second linearly TM-polarized single-mode wave 102.

The electro-optical differential phase modulator 16 having a different efficiency according to the polarization, it generates a phase difference of the two waves and will enable modulating the phase. The end of the electro-optical differential phase modulator 16 is here directly connected to the fiber-optic device 400.

The fiber-optic device 400 here comprises a section of linear polarization-maintaining optical fiber 74, an optical phase retarder 42 (hereafter optical retarder) and a reflector 26. The optical fiber section 74 and the detection optical fiber 73 are arranged in series and connected to each other by the optical retarder 42. The reflector 26 is arranged at an other end, or distal end, of the detection optical fiber 73. The fiber-optic device 400 stays mainly outside the casing of the source-receiver block 200.

In the forward direction, the first TE-polarized single-mode wave 101 and the second TM-polarized wave 102 are injected at a proximal end of the section of linear polarization-maintaining optical fiber 74. The optical retarder 42 is arranged between a distal end of the section of linear polarization-maintaining optical fiber 74 and a proximal end of the detection optical fiber 73. The optical retarder 42 is for example a quarter-wave plate. As an alternative, the optical retarder 42 is consisted of an optical fiber with an elliptic core, the length and orientation of which are determined to induce a quarter-wave phase difference.

The first TE-polarized single-mode wave 101 and the second TM-polarized single-mode wave 102 are injected into the section of linear polarization-maintaining optical fiber 74. Advantageously, the eigen-axes of the polarization-maintaining optical fiber 74 are aligned to the TE and TM polarization axes. The section of polarization-maintaining optical fiber 74 carries the first polarized single-mode wave 101 and the second polarized single-mode wave 102, while keeping the linear polarization of each of these waves. This section of polarization-maintaining optical fiber 74 is used to offset the sensitive part of the sensor consisted by the optical fiber 73 with respect to the casing of the source-detector block 200. The section of polarization-maintaining optical fiber 74 has a length of between 1 m and 10 km, for example of about 400 m. The section of polarization-maintaining optical fiber 74 is optional.

The optical retarder 42 receives the first linearly TE-polarized single-mode wave, denoted 101, and forms a first, right, circular polarization single-mode wave 111. Similarly, the optical retarder 42 receives the second linearly TM-polarized single-mode wave, denoted 102, and forms a second, left, circular polarization single-mode wave 112. The two circularly polarized waves 111 and 112 are simultaneously injected into the detection optical fiber 73. The detection optical fiber 73 is used as a fiber sensitive to a rotary magneto-optic effect. Advantageously, the detection optical fiber 73 is a polarization-maintaining fiber twisted at the fiber draw, also called SPUN fiber. Such a fiber makes it possible to keep the circular polarization of light. That way, the first, right, circular polarization single-mode wave 111 propagates in the detection optical fiber 73 while keeping a right circular polarization all along the detection optical fiber 73, up to the reflector 26. Likewise, the second, left, circular polarization single-mode wave 112 propagates in the detection optical fiber 73 while keeping a left circular polarization all along the fiber 73, up to the reflector 26.

The reflector 26 is for example a mirror in free space. As an alternative, the distal end of the detection optical fiber 73 is metallized to form the reflector 26.

After a first passage in the detection optical fiber 73, the two orthogonal circular polarization single-mode waves 111, 112 reflect on the mirror 26. Upon reflection on the mirror 26, the polarization states of the two single-mode waves are reversed. Upon reflection on the reflector 26, the first, right, circular polarization single-mode wave 111 changes of propagation direction and of polarization to form a first, left, circular polarized wave 111. And conversely, upon reflection on the reflector 26, the second, left, circular polarization single-mode wave 112 changes of propagation direction and of polarization to form a second, right, circular polarized wave 112. The two circularly polarized reflected waves 111, 112 propagate in the return direction in the detection optical fiber 73, while keeping their respective circular polarization. In the return direction, the optical retarder 42 receives the first, left, circular polarized wave 111 and transforms it into a first linearly TM-polarized wave. Similarly, in the return direction, the optical retarder 42 receives the second, right, circular polarized wave 112 and transforms it into a second linearly TE-polarized single-mode wave.

In the return direction, the first linearly TM-polarized single-mode wave and the second linearly TE-polarized single-mode wave are transmitted directly to the electro-optical differential phase modulator 16, then to the polarizer 24.

In the return direction, the differential phase modulator and the polarizer recombine the first linearly TM-polarized single-mode wave and the second linearly TE-polarized single-mode wave to form a linearly polarized interferometric beam 300.

In all the embodiments, the source-receiver splitter 22 guides the interferometric beam 300 towards the photodetector 18. The detector 18 receives the interferometric beam and generates a detected signal 80.

Figure 2:
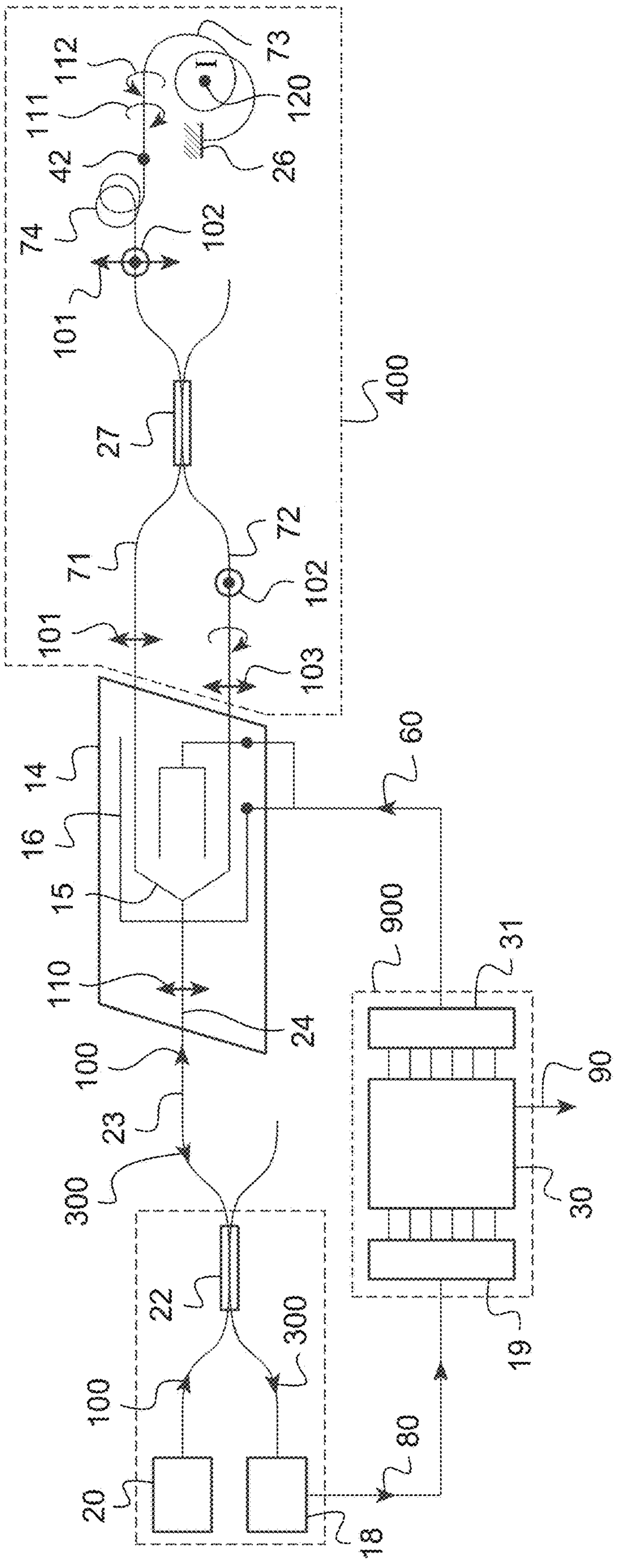
FIG. 2 illustrates a second embodiment of an electric current or magnetic field sensor based on a reflection fiber-optic interferometer.

In the second embodiment, illustrated in FIG. 2, the polarization splitter comprises a spatial splitter, for example consisted of a Y-junction, denoted 15, that separates the linearly polarized source beam 110, for example of the TE type, and a first TE-polarized single-mode wave 101 and a second TE-polarized single-mode wave 103. The polarizer 24 is advantageously a waveguide polarizer formed by the common branch of the Y-junction, denoted 15. In this case, the first TE-polarized single-mode wave 101 and the second TE-polarized single-mode wave 103 each propagate on a single-mode waveguide distinct from the electro-optical differential phase modulator 16, for example made of lithium niobate on an optical integrated circuit. Advantageously, the Y-junction and the electro-optical differential phase modulator 16 are made on a same optical integrated circuit 14. In this case, the waveguide is preferably formed by exchange of protons, in order to guide a single polarization state on the common branch of the Y-junction.

In the second embodiment, the fiber-optic device 400 further includes an optical fiber section 71 and an other optical fiber section 72, each connected, on the one hand, to an output waveguide of the electro-optical differential phase modulator 16 and, on the other hand, to a polarization coupler-splitter 27.

In the forward direction, at the output of the electro-optical differential phase modulator 16, the first single-mode wave 101 propagates in the section of polarization-maintaining optical fiber 71. The second single-mode wave 103 propagates in the other section of polarization-maintaining optical fiber 72. The other optical fiber section 72 is oriented so as to rotate by 90 degrees the linear polarization of the second single-mode wave 103, which thus becomes a second linearly polarized single-mode wave 102 with a polarization orthogonal to the first single-mode wave 101. The polarization coupler-splitter 27 recombines the first single-mode wave 101 and the second single-mode wave 102, of orthogonal linear polarizations on a same single-mode waveguide. The polarization coupler-splitter 27 is connected to a proximal end of the section of linear polarization-maintaining optical fiber 74.

The propagation of the first single-mode wave 101 and the second single-mode wave 102 along a round trip through the optical retarder 42, the detection optical fiber 73 and the reflection on the reflector 26 is similar to that described in relation with the first embodiment.

In the return direction, after reflection on the reflector and transmission via the detection optical fiber 73, the optical retarder 42 and the fiber section 74, the first linearly TM-polarized single-mode wave is transmitted via the other optical fiber section 72 that rotates by 90 degrees the linear polarization of the first single-mode wave, that thus becomes a first linearly TE-polarized single-mode wave. The second linearly TE-polarized single-mode wave is transmitted by the section of polarization-maintaining optical fiber 71. The Y-junction 15 recombines the first linearly TE-polarized single-mode wave and the second linearly TE-polarized single-mode wave to form the linearly polarized interferometric beam 300, here of the TE type.

In the first and second embodiments, we thus have the first single-mode wave 101 linearly polarized according to a first polarization state and the second single-mode wave 102 linearly polarized according to a second polarization state, transverse to the first polarization state, propagating on a single and same waveguide, either directly at the output of the electro-optical differential phase modulator 16, or at the output of the polarization coupler-splitter 27.

In the first and the second embodiments, the electro-optical differential phase modulator 16 modulates the polarization phase of the first linearly TE-polarized single-mode wave 101 with respect to the phase of the second linearly TM-polarized single-mode wave 102. For that purpose, the electro-optical differential phase modulator 16 applies a phase difference Φm(t) periodically modulated with a modulation period T.

Figure 3:
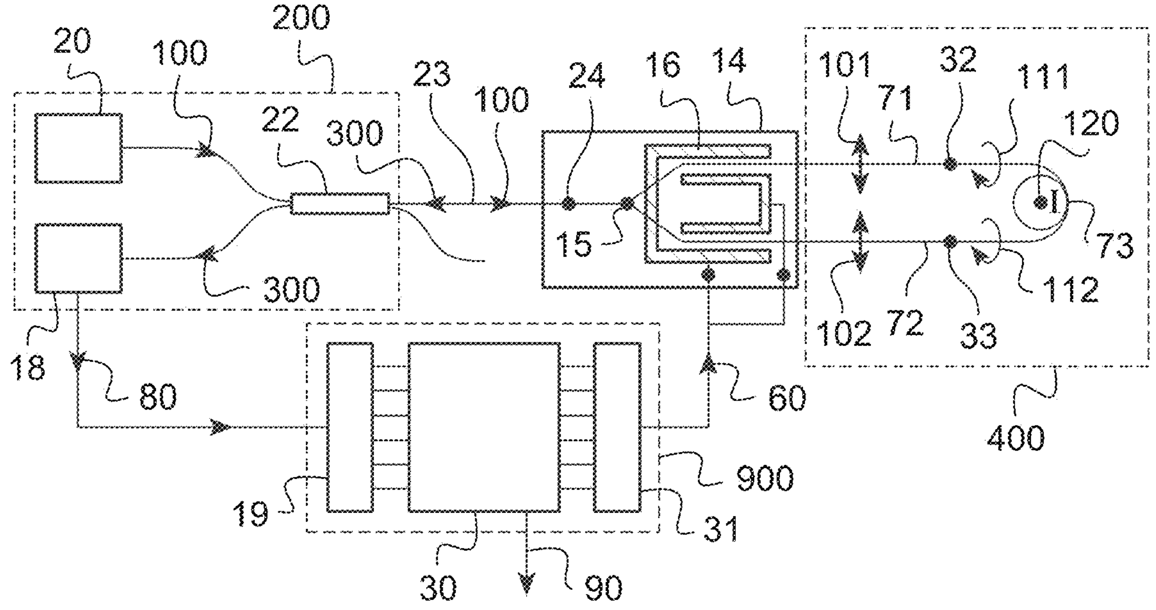
FIG. 3 illustrates a third embodiment of an electric current or magnetic field sensor based on a fiber-optic Sagnac interferometer.

FIG. 3 shows an electric current or magnetic field sensor based on a fiber-optic Sagnac interferometer, according to a third embodiment. The elements common to the first two embodiments are present: the light source 20 generating a source beam 100, a fiber-optic device 400 forming a closed optical path to surround an electric conductor 120, a detection system 18 and a signal-processing system 900. In this third embodiment, the so-called loop Sagnac interferometer uses a closed optical path, generally between the two ends of an optical fiber coil 73. An optical component, for example consisted of a Y-junction, denoted 15, splits the source beam 100 into two distinct waves that travel through the closed optical path in mutually opposite directions and the same optical component recombines the two waves at the output of the optical fiber coil. In a loop fiber-optic interferometer, the two split waves use the same state of polarization on the closed optical path. At rest, the optical paths travelled by the two waves are perfectly reciprocal. The polarizer 24, the Y-junction denoted 15 and the differential phase modulator 16 are arranged and operate similarly to the same elements described in connection with FIG. 2.

In the third embodiment, the fiber-optic device 400 includes the detection optical fiber 73 connected at each of its ends to an optical phase retarder, respectively denoted 32 and 33. The fiber-optic device 400 further includes a section of polarization-maintaining optical fiber 71 and an other section of polarization-maintaining optical fiber 72. The optical fiber section 71 is connected, on the one hand, to an output waveguide of the optical differential phase modulator 16 and, on the other hand, to the optical retarder 32. The other optical fiber section 72 is connected, on the one hand, to an other output waveguide of the optical differential phase modulator 16 and, on the other hand, to the optical retarder 33. The detection optical fiber 73 is wound to as to form at least one turn about the electric conductor 120, in an application to a current sensor.

The optical phase retarder 32, respectively 33, is for example a quarter-wave plate.

In the third embodiment, in the forward direction, at the output of the optical differential phase modulator 16, the first single-mode wave 101 propagates in the section of polarization-maintaining optical fiber 71 and the second single-mode wave 102 propagates in the other section of polarization-maintaining optical fiber 72. The first single-mode wave 101 and the second single-mode wave 102 are of parallel linear polarizations, for example here of the TE type. The optical retarder 32, respectively 33, receives the first single-mode wave 101, respectively the second single-mode wave 102, and transforms it into a first, right, circular polarization single-mode wave 111, respectively a second, right, circular polarization single-mode wave 112. The first, right, circular polarization single-mode wave 111, respectively a second, right, circular polarization single-mode wave 112, travel through the detection optical fiber 73 in mutually opposite directions. At the output of the detection optical fiber 73, the optical retarder 32, respectively 33, receives the second, right, circular polarization single-mode wave 112, respectively the first, right, circular polarization single-mode wave 111, and transforms it into a second linear TE-polarization single-mode wave, respectively a first linear TE-polarization single-mode wave. As in the second embodiment, the optical differential phase modulator 16 and the Y-junction 15 recombine the first linear TE-polarization single-mode wave and the second linear TE-polarization single-mode wave to form a linearly polarized interferometric beam 300.

In the return direction, in the three embodiments described hereinabove, after a travel time $\Delta\tau$, the optical differential phase modulator 16 receives the first linearly polarized single-mode wave and the second linearly polarized single-mode wave. The optical differential phase modulator 16 modulates the polarization phase of the first polarized wave with respect to the phase of the second polarized single-mode wave. Therefore, the optical differential phase modulator 16 forms a first output wave and, respectively, a second output wave, having a modulated phase difference $\Delta\Phi m(t)=\Phi m(t)-\Phi m(t-\Delta\tau)$. Here, $\Delta\tau$ represents the round-trip travel time of each wave in the fiber-optic device 400.

In the first embodiment, the travel time $\Delta\tau$ to be considered for the phase modulation $\Delta\Phi(m(t)$ is the travel time of the first wave or the second wave for a round-trip in the section of polarization-maintaining fiber 74 and the detection optical fiber 73.

In the second embodiment, the travel time $\Delta\tau$ to be considered for the phase modulation $\Delta\Phi(m(t)$ is the travel time of the first wave or the second wave for a travel in the optical fiber sections 71 and 72 and for a round-trip in the polarization-maintaining fiber section 74 and the detection optical fiber 73.

In the third embodiment, the travel time $\Delta\tau$ to be considered for the phase modulation $\Delta\Phi(m(t)$ is the travel time of the first wave or the second wave for a travel in an optical fiber section 71, an optical fiber section 72 and for a one-way travel in the detection optical fiber 73.

In the examples illustrated in FIGS. 1 to 3, a digital signal-processing system is used. As an alternative, the signal-processing system can be fully analog.

In FIGS. 1 to 3, the signal-processing system 900 comprises for example an analog-digital converter 19, a digital processor 30, for example of the DSP (Digital Signal Processor), FPGA (Field Programmable Gate Array) or ASIC (Application Specific Integrated Circuit) type, and a digital-analog converter 31. The digital processor 30 makes it possible to extract a signal from a parameter 90 to be measured, for example the magnetic field or the intensity of an electric current, on a digital output. The digital-analog converter 31 makes it possible to apply a modulation voltage 60 to the electrodes of the optical differential phase modulator 16. The results of the measured parameter(s) 90 are for example displayed on a human-machine interface.

The signal-processing system 900 applies any one of the known modulation-demodulation schemes to extract a phase difference measurement, which is then transformed into an intensity of the electric current. A phase difference modulation $\Phi m(t)$ is obtained by applying a modulated electric voltage 60 Vm(t) to the electrodes of the differential phase modulator 16. In the case of a digital modulation, the modulation voltage includes M modulation states, where M is an integer number, for example equal to 4, 6, 8 or 12. However, there also exist analog modulation/demodulation schemes that the person skilled in the art will easily adapt.

The phase difference modulation $\Phi m(t)$ is periodic with a modulation period T such as $T/2=1/(2\cdot Fp)=\Delta\tau$, where Fp represents the nature frequency of the fiber-optic device 400. The detection system 18 acquires the power of the interferometric beam at the interferometer output in the M modulation states. The signal-processing system digitizes the detected interferometric beam and demodulates the detected signal.

In the application to an electric current sensor, the detection optical fiber 73 is wound to form a coil around an electric conductor 120 in which circulates an electric current of intensity I. The coil axis of the detection optical fiber 73 is coincident with the longitudinal axis of the electric conductor 120. The number of closed turns of the detection optical fiber 73 around the electric conductor 120 is denoted N. The electric conductor induced a magnetic field B along circular field lines around the circumference of the electric conductor 120.

As described hereinabove, it is known that the interferometric phase difference $\Delta\phi$ introduced by a magneto-optic Faraday effect between the two circularly polarized waves at the output of the detection fiber 73 after a round-trip in a reflection interferometer is linked to the intensity I of the electric current by the following equation, in which V represents the Verdet constant of the detection optical fiber 73, when the interferometric system is perfect.

$$\Delta\phi = 4VNI \qquad \text{[Math. 1]}$$

In this case, the scaling factor is equal to 4 VN. The Verdet constant of silica is equal to about 0.6 rad $T^{-1}m-1$ at the wavelength of 1550 nm. N represents the number of turns of the sensitive optical fiber, N being between 1 and 100,000, and generally less than 20,000.

As described hereinabove, in the case of a Sagnac interferometer, the scaling factor is equal to 2 VN.

An in-line or loop fiber-optic interferometer including a detection optical fiber 73 thus makes it possible to measure a magnetic field or an electric current.

Figure 4:
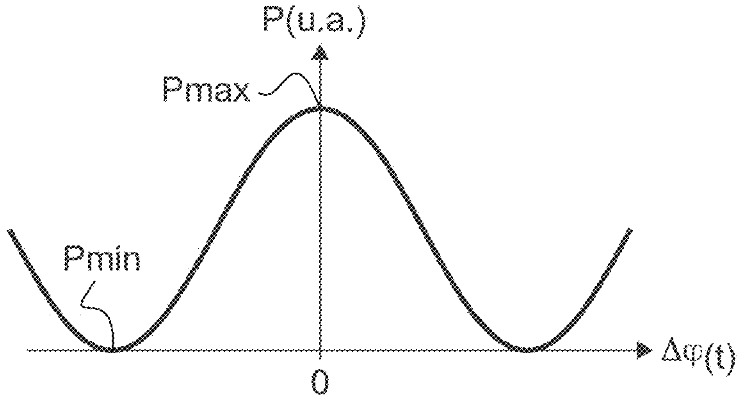
FIG. 4 shows a theoretical power response curve for the detected interferometric signal as a function of a phase difference introduced by the signal to be measured or by the modulation added using the differential phase modulator, in the absence of defects.

FIG. 4 shows the interferometer response in terms of power measured as a function of the phase difference $\Delta\varphi(t)$ introduced by the differential phase modulator 16, in the case of a perfect interferometer. In theory, the phase difference is perfectly modulated between a maximum value, denoted P0, and a minimum value Pmin, equal to zero.

However, errors may affect the response of such an interferometer.

For example, in the first embodiment, the angle between the polarizer 24 and the optical differential phase modulator 16 is denoted $\theta$. Generally, as indicated hereinabove, $\theta$ is adjusted at about 45 degrees. In the second embodiment, the angle $\theta$ represents, for example, an imbalance between the two branches of the Y-junction 15, which does not split the source wave 50-50 between the two branches.

The modulation amplitude, denoted Pmodulation, of the detected power is expressed as the difference between the maximum power, denoted Pmax, and the minimum power, denoted Pmin.

When the interferometer is perfect, we obtain, as illustrated in FIG. 4:

$$P_{modulation} = P_{max} - P_{min} = P_0 \frac{\sin^2(2\cdot\theta)}{2} \quad \text{[Math 2]}$$

$$P_{min} = 0$$

However, the interferometric system can have a defect, for example a misalignment between the eigen-axes of the fibers 73 and 74, a defect of the optical retarder 42, that is not exactly a quarter-wave plate at the wavelength used or also a residual birefringence. In this case, assuming that VNI is small, the measured phase difference becomes $\Delta\phi = 4VNI/\cos(2\gamma)$, where $\gamma$ represents the angle of the defect considered, for example due to a misalignment of the fiber 74 or a defect of the quarter-wave plate 42. Here, an angle is considered as being small when it is less than about 0.1 rad.

Figure 5:
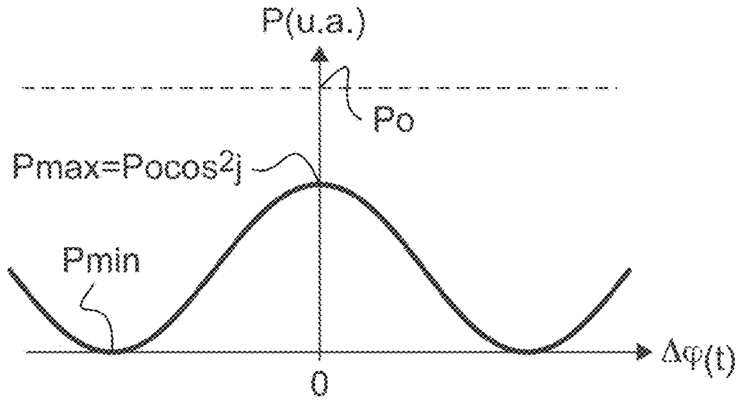
FIG. 5 shows a power response curve for a part of the detected interferometric signal as a function of a phase difference introduced by the signal to be measured or by the modulation added using the modulator, in the case of a fiber-optic interferometer having a scaling factor defect.

FIG. 5 represents a part of the detected interferometric signal corresponding to the interferences between the two main waves and to the interferences between the two waves doubly coupled by a defect $\gamma$, these waves having travelled through the interferometer as a function of a phase difference $\Delta\varphi(t)$ modulated as a function of the current or magnetic field measurement or as a function of the phase difference introduced by the modulation thanks to the modulator and in the presence of a defect $\gamma$. The power of the source is denoted $P_0$. Instead of reaching the maximum value $P_0$, the maximum power of this part of the detected signal is limited to the value $P_0\cdot\cos^2(\gamma)$.

Figure 6:
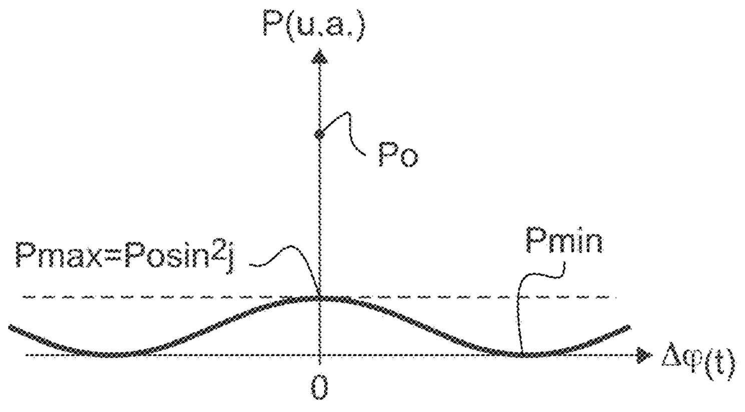
FIG. 6 shows a power response curve for an other part of the detected interferometric signal as a function of a phase difference introduced by the signal to be measured, in the case of a fiber-optic interferometer having a scaling factor defect.

However, the defect $\gamma$ also induces interferences between other simply coupled parasitic waves, which contribute to an other part of the detected signal. As illustrated in FIG. 6, it is shown that the amplitude of this other part of the interferometric signal as a function of a phase difference $\Delta\varphi(t)$ due to the signal to be measured has a maximum power equal to $P_0\cdot\sin^2(\gamma)$. The phase modulation through the modulator has no effect on these signals as long as they are decoupled from the main and double signals of FIG. 5.

Figure 7:
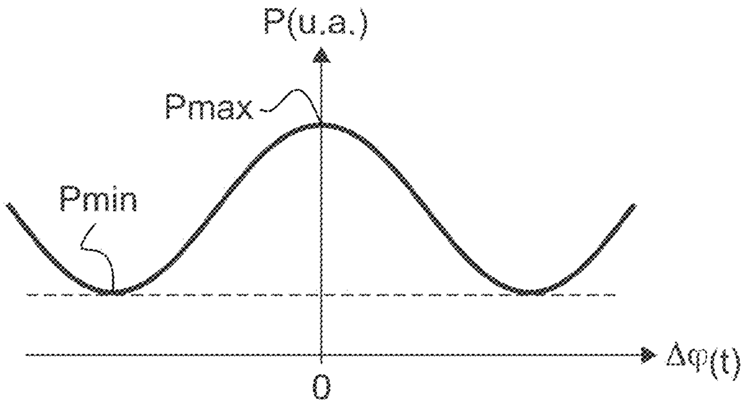
FIG. 7 shows a power response curve resulting from the sum of the detected interferometric signals as a function of a phase difference introduced by the modulation added using the modulator, shown in FIGS. 5 and 6, in the case of a fiber-optic interferometer having a scaling factor defect.

More precisely, when the interferometer is imperfect, we obtain, as illustrated in FIG. 7, the sum of these two interference signals corresponding to a detected interferometric signal that is modulated between a value Pmin, equal to $P_0\cdot\sin^2(\gamma)$ and a maximum value Pmax. More precisely, FIG. 7 represents the power as a function of the modulation applied to the phase modulation.

$$P_{modulation} = P_{max} - P_{min} = P_0 \frac{\sin^2(2\cdot\theta)\cdot\cos^2(2\cdot\gamma)}{2} \quad \text{[Math 3]}$$

$$P_{min} = P_0 \frac{\sin^2(2\cdot\gamma)}{2}\cdot\frac{(1+\cos^2(2\cdot\theta))}{2}$$

It is observed that the interferometer is no longer perfectly contrasted, the minimum power Pmin being non-zero and the modulation amplitude being reduced, which degrades the scaling factor of the interferometric system.

In the case of a Sagnac interferometer, this technical problem of degradation of the scaling factor also occurs for example if a defect exists on each quarter-wave plate 32, 33 at the ends of the detection optical fiber 73. It is observed in this case that Pmin remains close to zero and that the value of Pmax is reduced. Consequently, the amplitude Pmax−Pmin decreases by comparison with a Sagnac interferometer using perfect components.

These undesirable effects may be due to parasitic couplings in the fiber-optic interferometer. They can have for origin thermal instabilities in the detection optical fiber 73 due to the fact that an orientation or optical delay defect of the optical retarder 42, or respectively of each of the optical retarders 32 and 33.

Figure 8:
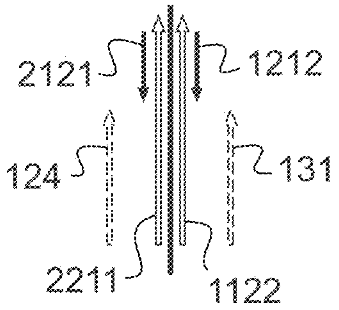
FIG. 8 is a schematic view in the form of phasors of different beams propagating in a fiber-optic interferometer in an application of magnetic field or electric current sensor, in the absence of Faraday effect.
Figure 9:
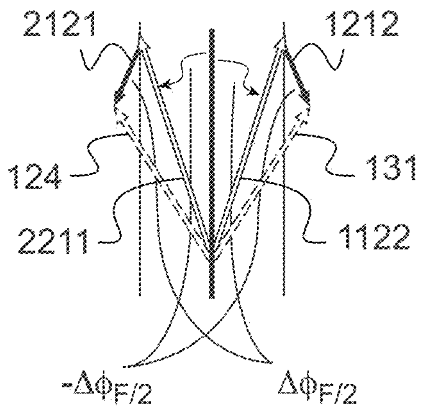
FIG. 9 is a schematic view in the form of phasors of different beams propagating in the same fiber-optic interferometer, in the presence of Faraday effect.

A graphic representation of the phase difference measurement error linked to this degradation of the scaling factor is illustrated in relation with FIGS. 8 and 9. The propagation of the polarized waves in the in-line fiber-optic interferometer will now be described in detail in terms of phase vector in relation with FIG. 8, i.e. in the case of an imperfect interferometer but at rest, in the absence of magneto-optic Faraday effect.

At the output of the optical differential phase modulator 16, in the return direction, let's note $A_{1122}$ the first polarized single-mode wave, i.e. the main wave travelling with a TE-polarization (or in "1") in the optical differential phase modulator 16 in the forward direction, with a right circular polarization (in "1") in the differential phase modulator 73 in the forward direction and with a left circular polarization (in "2") in the detection optical fiber 73 in the return direction and with a TM-polarization (in "2") in the optical differential phase modulator 16 in the return direction. At the output of the optical differential phase modulator 16, in the return direction, let's note $A_{2211}$ the second polarized single-mode wave, i.e. the main wave travelling with a TM-polarization (in "2") in the optical differential phase modulator 16 in the forward direction, with a left circular polarization (in "2") in the detection optical fiber 73 in the forward direction, then with a right circular polarization (in "1") in the detection optical fiber 73 in the return direction and with a TM-polarization (in "1) in the optical differential phase modulator 16 in the return direction.

The recombination of the first wave $A_{1122}$ and the second wave $A_{2211}$ forms the main interferometric signal.

However, in case of misalignment of the interferometer, there exist 6 other parasitic waves: two waves resulting from double couplings (third and fourth wave) and four other waves resulting from simple couplings (fifth to eighth wave).

The third wave $A_{1212}$ is the wave travelling with a TE-polarization (in "1") in the optical differential phase modulator 16 in the forward direction, with a left circular polarized (in "2") in the differential phase modulator 73 in the forward direction, with a right circular polarization (in "1") in the differential phase modulator 73 in the return direction and with a TM-polarization (in "2") in the optical differential phase modulator 16 in the return direction.

The fourth wave $A_{2121}$ is the wave travelling with a TM-polarization (in "2") in the optical differential phase modulator 16 in the forward direction, with a right circular polarization (in "1") in the detection optical fiber 73 in the forward direction, with a left circular polarization (in "2") in the detection optical fiber 73 in the return direction and with a TE-polarization (in "1") in the optical differential phase modulator 16 in the return direction.

The third wave $A_{1212}$ and the fourth wave $A_{2121}$ are coherent with the first wave $A_{1122}$ and the second wave $A_{2211}$ because they undergo exactly the same phase differences. Moreover, the third wave $A_{1212}$ and the fourth wave $A_{2121}$ are modulated similarly to the main signal, these are two waves that create a scaling factor problem.

There also exists a fifth wave, denoted $A_{1211}$, which is the wave travelling with a TE-polarization (in "1") in the modulator in the forward direction, with a left circular polarization (in "2") in the detection optical fiber 73 in the forward direction, with a right circular polarization (in "1") in the detection optical fiber 73 in the return direction and with a TE-polarization (in "1") in the optical differential phase modulator 16 in the return direction.

The sixth wave, denoted $A_{2122}$, is the wave travelling with a TM-polarization (in "2") in the modulator in the forward direction, with a right circular polarization (in "1") in the detection optical fiber 73 in the forward direction, with a left circular polarization (in "2") in the detection optical fiber 73 in the return direction and with a TM-polarization (in "2") in the optical differential phase modulator 16 in the return direction.

The seventh wave, denoted $A_{1121}$, is the wave travelling with a TE-polarization (in "1") in the modulator in the forward direction, with a right circular polarization (in "1") in the detection optical fiber 73 in the forward direction, with a left circular polarization (in "2") in the detection optical fiber 73 in the return direction and with a PE-polarization (in "1") in the optical differential phase modulator 16 in the return direction.

The eighth wave, denoted $A_{2212}$, is the wave travelling with at TM-polarization (in "2") in the modulator in the forward direction, with a left circular polarization (in "2") in the detection optical fiber 73 in the forward direction, with a right circular polarization (in "1") in the detection optical fiber 73 in the return direction and with a TM-polarization (in "2") in the optical differential phase modulator 16 in the return direction.

The fifth wave $A_{1211}$ and the seventh wave $A_{1121}$ are coherent with each other. The sixth wave $A_{2122}$ and the eighth wave $A_{2212}$ are also coherent with each other. On the other hand, the sixth wave and the eighth wave are not coherent with the fifth wave and the seventh wave. Indeed, a wide spectral band source, i.e. with a limited coherence length, is used here. The paths 1 and 2 have a difference of optical path length greater than the coherence length of the source.

The fifth to eighth waves do not create any scaling factor problem. On the other hand, these waves can tell us about the proportion of waves that create a scaling factor problem. Indeed, by conservation of energy, they are complementary to the waves used for measurement.

FIG. 8 shows the first to fourth waves, in the form of phase vectors or phasors, in the absence of magneto-optic Faraday effect. The first wave $A_{1122}$ and the second wave $A_{2211}$ have exactly the same amplitude. The third wave $A_{1212}$ and the fourth wave $A_{2121}$ have exactly the same amplitude, but their amplitude is far less than that of the first and the second wave, because the third wave $A_{1212}$ and the fourth wave $A_{2121}$ result from a defect or a parasitic coupling of the interferometer. Therefore, the result 131 of the combination of the first wave $A_{1122}$ and of the third wave $A_{1212}$ is of reduced amplitude with respect to the amplitude of the first wave and parallel to this first wave. The result 124 of the combination of the second wave $A_{2211}$ and of the fourth wave $A_{2121}$ is of reduced amplitude with respect to the amplitude of the second wave, and parallel to this second wave.

FIG. 9 shows the first to fourth waves, in the form of phasors, in the presence of a magneto-optic Faraday effect. The magneto-optic Faraday effect induces a phase difference equal to $\Delta\Phi_F/2$ on the first wave $A_{1122}$ and a phase difference equal to $-\Delta\Phi_F/2$ on the second wave $A_{2211}$. Simultaneously, the magneto-optic Faraday effect also induces a phase difference equal to $\Delta\Phi_F/2$ on the third wave $A_{1212}$ and a phase difference equal to $-\Delta\Phi_F/2$ on the fourth wave $A_{2121}$. The result 131 of the recombination of the first wave $A_{1122}$ and the third wave $A_{1212}$ has an amplitude and phase angle modified with respect to the first wave $A_{1122}$. Similarly, the result 124 of the combination of the second wave $A_{2211}$ and the fourth wave $A_{2121}$ has an amplitude and a phase angle modified with respect to the second wave $A_{2211}$. FIG. 9 schematically illustrates the error introduced by the third and fourth waves on the magneto-optic phase difference measurement. It is also observed that the amplitude of the resulting waves is reduced with respect to the amplitude of the main waves.

This magneto-optic phase difference measurement error induces a defect in the scaling factor. As seen hereinabove, in a perfect reflection interferometer, the scaling factor is equal to 4VN. In a reflection interferometer having defects, the scaling factor is modified and becomes 4VN/cos(2γ). In a Sagnac interferometer, the scaling factor is similarly modified and becomes 2VN/cos(2γ).

According to the present disclosure, the power modulation amplitude of the detected interferometric beam, in other words Pmax−Pmin or Pmodulated, is proportional to $\cos^2(2\gamma)$, where γ represents the angle of the defect impacting the scaling factor, and the minimum power of the detected interferometric beam, Pmin, is proportional to $\sin^2(2\gamma)$.

A measurement of the angle of a defect impacting the scaling factor is deduced from a measurement of the power modulation amplitude of the detected interferometric beam and/or a measurement of the minimum power of the detected interferometric beam.

In particular, in a reflection interferometer, the detection that the minimum power Pmin is non-zero enables to highlight a scaling factor defect. For example, the power arriving on the photodetector is of about P=30 μW at the maximum power. In the presence of a defect such that cos(2γ)=99.5%, the minimum power is equal to $Pmin=P*\sin^2(2\gamma)$, i.e. 1% of P, i.e. about 0.3 μW. The power modulation amplitude Pmax−Pmin is then equal to 99% of P, i.e. 29.7 μW. In a loop interferometer (3rd embodiment), there is no variation of the minimum but only of the amplitude Pmax−Pmin.

More generally, a measurement of variation of the minimum power of the detected interferometric beam or a measurement of amplitude power modulation variation of the detected interferometric beam enable to measure a variation of the scaling factor as a function of time for an in-line fiber-optic interferometer.

In practice, there exists different manners to measure the minimum power Pmin and the power modulation amplitude of the detected interferometric beam.

An interferometric system with an example of phase modulation and demodulation of the detected signal, adapted to measure a signal representative of a misalignment of the interferometer, this misalignment being liable to degrade the scaling factor, will now be described in detail.

In the field of the in-line fiber-optic interferometric systems, different modulation and demodulation techniques are known. This modulation is obtained by applying a modulated electric voltage Vm(t) between the electrodes of the differential phase modulator 16 to modulate the phase difference ΔΦ(m(t) of the interferometric signal measured. This modulation provides a biasing that increases the interferometric system sensitivity, in particular for low-amplitude magnetic field or electric current measurements.

In particular, it is known to apply a so-called 2-state modulation, by square modulating the modulation voltage Vm between two step values, in order to produce a modulation of the phase difference on two levels, for example $\Delta\Phi(b(t)=\pm\pi/2$, called the biasing phase difference, at the natural frequency Fp of the fiber-optic device 400. The natural frequency Fp is defined in such a way that $T/2=1/(2\cdot Fp)=\Delta\tau$, where T represents the period of the square modulation. Therefore, the half-modulation period T/2 corresponds to the travel time $\Delta\tau$ of each single-mode wave in the fiber-optic device 400. The signal-processing system digitizes the detected interferometric beam and demodulates at the natural frequency Fp of the detected signal by sampling two power measurements on each modulation period and by allocating a negative signal to a first level and a positive signal at the following level.

In order to extend and linearize the response dynamics of an interferometric system, it is also known to apply a counter-reaction signal.

In the following of the present document, it is meant by level (or modulation level), the asymptotic value of the different values of modulated phase difference $\Delta\Phi_m$ for each modulation step. It is meant by modulation states, the different measured power values P corresponding to the modulation levels that follow each other on each modulation period. Over a modulation period, several states can use a same modulation level.

Finally, the patent application FR 3095053A1 describes a system based on a modulation including per modulation period T at least eight modulation levels and on the acquisition of at least 12 power measurements of the detected interferometric beam per modulation period. The signal processing extracts a signal representative of the quantity to be measured, which is equal to a sum of the interferometric beam power measurements acquired per modulation period, each measurement being assigned a sign +1 or −1.

Advantageously, the interferometer comprises a feedback system adapted to control the measurement of the signal representing the quantity to be measured, on the basis of a transfer function signal of the differential phase modulator and/or the transfer function signal of the detection system.

Figure 10:
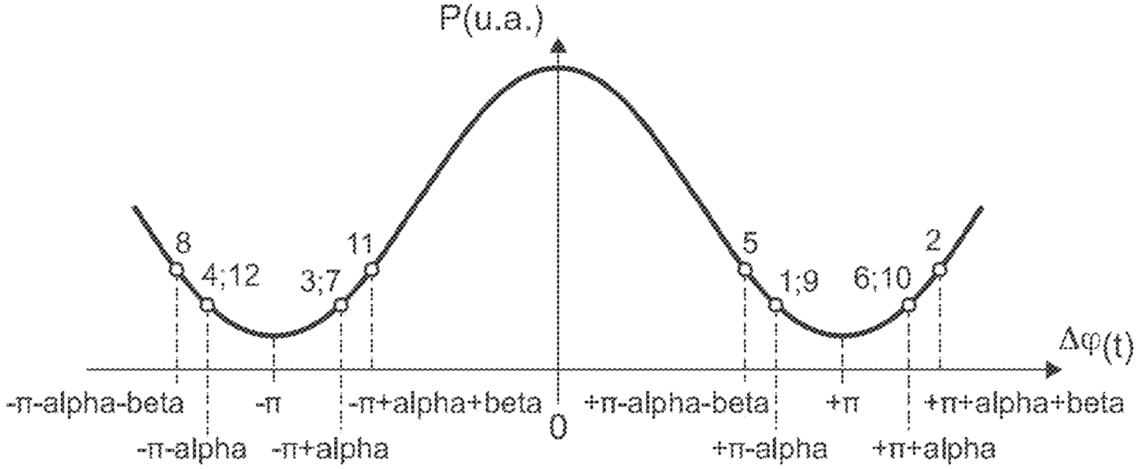
FIG. 10 is a schematic representation of an example of 8-level and 12-level modulation.

The example described in detail here uses an 8-level and 12-state modulation/demodulation scheme, based on that of the patent application FR 3 095 053. The modulation scheme is illustrated in FIG. 10. It is reminded that the voltage and phase modulations are homothetic because we are at the natural frequency Fp. More precisely, we use a modulation with 8 levels of $\Delta\Phi m(t)$ and 12 states of the corresponding detected power P(t).

The modulation is defined in the following Table 1, in which a (also noted alpha) represents the conventional modulation from π and β (also noted beta) the over-modulation added to modulate over 8 levels:

TABLE 1

| | 1 | 2 | 3 | 4 | 5 | 6 | 7 | 8 | 9 | 10 | 11 | 12 |
|---|---|---|---|---|---|---|---|---|---|---|---|---|
| modulation | II − α | II + α + β | -II + α | -II − α | II − α − β | II + α | -II + α | -II − α − β | II− α | II + α | -II + α + β | -II − α |

Within the framework of the present disclosure, the case considered is an at least 4-state digital modulation, to enable measuring on the one hand the magneto-optic Faraday phase difference, and on the other hand, the minimum power and/or the power modulation amplitude ($P_{max}-P_{min}$).

In the field mentioned above, the patent FR2654827_A1 proposes to apply a so-called 4-state modulation voltage that generates 4 successive levels of modulation on each modulation period T equal to $2\Delta\tau$, and to sample 4 power measurements on each modulation period. In the 4-state modulation, it is also possible to extract a signal, called $V\pi$ or $V_{Pi}$, modulated at 2Fp. The signal $V\pi$ represents the transfer function of the differential phase modulator, i.e. the ratio between the tension Vm applied to the modulator and the induced phase difference $\Phi m$, with $V\pi/\pi=Vm/\Phi m$. Or this signal $V\pi$ fluctuates with the environment, for example with the temperature of the differential phase modulator 16.

In the field of fiber-optic interferometric systems, the patent EP2005113_B1 describes a so-called 6-state modulation, based on 4 levels of biasing phase difference. This 6-state modulation can be broken down into a superposition of a first modulation of the phase difference $\Phi m(t)$ of $\pm\pi/2$ at the natural frequency Fp and a second modulation of the phase difference $\Phi m(t)$ at ±alpha/2 at 3*Fp. 6 power measurements are sampled in each modulation period.

The patent EP2005113_B1 also describes the use of an 8-state and 8-level modulation over a total period T equal to $4\Delta\tau$. According to this conventional 8-state modulation, the modulation is first performed on 4 high states corresponding to ±(alpha+beta) then on 4 other low states corresponding to ±(alpha−beta). The output power P is sampled into 8 measurements Pi corresponding to the 8 states i=1, . . . , 8 per modulation period.

According to a particular and advantageous aspect, the demodulation of the 12 states is defined in the following Table 2, which shows the sign or the coefficient applied to the measurement of each of the 12 power states to deduce therefrom the different signals. More precisely, as indicated in the first line of Table 2, a signal representative of the magnetic field or electric current signal, corresponding to the magneto-optic Faraday phase difference, is calculated. As indicated in the second line of Table 2, a signal representative of the signal VT (or Vpi), i.e. representative of the transfer function of the optical differential phase modulator, is optionally calculated. As indicated in the third line of Table 2, according to an aspect of the present disclosure, a signal representative of the modulated power is calculated. Optionally, as indicated in the fourth line of Table 2, a signal representative of the mean power is calculated. The mean power measurement enables to differentiate the scaling factor defects or variations of the power variations of the source.

TABLE 2

| | 1 | 2 | 3 | 4 | 5 | 6 | 7 | 8 | 9 | 10 | 11 | 12 |
|---|---|---|---|---|---|---|---|---|---|---|---|---|
| Magnetic field/ electric current | − | + | + | − | − | + | + | − | − | + | + | − |
| Vpi | 0 | 0 | − | + | 0 | 0 | 0 | 0 | − | + | 0 | 0 |
| Power/modulated power | 0 | + | 0 | 0 | 0 | − | 0 | + | 0 | 0 | 0 | − |
| mean | + | + | + | + | + | + | + | + | + | + | + | + |

We thus have a modulation-demodulation method perfectly adapted to measure simultaneously, at each modulation period, an electric current or magnetic field measurement and a measurement of the modulated power. Optionally, a measurement of the mean power and/or a measurement of the signal Vπ (or Vpi) representative of the transfer function of the differential phase modulator is further calculated.

First, the interferometer response is calculated in the ideal or faultless case, illustrated for example in FIG. 1. We will then show how a scaling factor defect γ affects the different, open-loop, and respectively closed-loop, measurements.

It is assumed that the light source 20 emits a non-polarized source beam 100. The source beam 100 has a total power $P_0=A_0^2$ with $A_0$ the amplitude of the source wave. The input-output polarizer 24 is for example a polarizing fiber, also called PZ fiber, whose axes are perfectly aligned at 45 degrees from the birefringence axes of the optical modulator 16 at the input-output 25 of the integrated optical circuit 34. It is assumed that the linear polarization-maintaining optical fiber 74 is perfect, i.e. without coupling defect between transverse polarization modes. The linear polarization-maintaining optical fiber 74 is also called offset fiber. It is assumed that the quarter-wave plate 42 is perfect and oriented at 45 degrees with respect to the eigen-axes of the linear polarization-maintaining optical fiber 74. The polarization-maintaining detection optical fiber 73, twisted at the fiber draw, is also called SPUN fiber or also sensor fiber because it is the sensitive part of the magnetic field or electric current sensor. It is assumed that the sensor fiber (SPUN) 73 perfectly keeps the right circular polarization and, respectively, the left circular polarization. The phase difference introduced by the magneto-optic phase difference magnetic field is denoted $\varphi_s$.

At the output of the polarizer 24 (PZ fiber), the power of the light beam is reduced by half because the light source 20 is not polarized.

The power $P_1$ at the output of the polarizing fiber 24 is thus equal to:

$$P_1 = \frac{P_0}{2} = \frac{A_0^2}{2} \quad \text{[Math 4]}$$

The wave amplitude at the output of the polarizer 24 (at the input of the differential phase modulator) is thus of $A_0/\sqrt{2}$ along the polarization axis of the PZ fiber 74 and zero along the other axis because, here, a perfect polarizer 24 is considered.

The angle between the polarization axis of the PZ fiber 24 and the TE-axis of the differential phase modulator 16 is denoted θ. The linearly polarized beam can now be projected on the TE and TM axes of the differential phase modulator 16. The following amplitudes are obtained:

$$A_{TE} = \frac{A_0}{\sqrt{2}} e^{int} \cdot \cos(\theta) \text{ and } A_{TM} = \frac{A_0}{\sqrt{2}} e^{int} \cdot \sin(\theta) \quad \text{[Math 5]}$$

Each polarized wave propagates in a perfect manner in the interferometer except at the coupling between the differential phase modulator 16 and the linear polarization-maintaining fiber 74. The angle between the TE-axis of the differential phase modulator 16 and the fast axis or TE-axis of the PM fiber 74 is denoted γ.

Result of the Closed-Loop Demodulation

In any case, it assumed that the voltage Vpi is effectively controlled by the standard demodulation because the demodulation states are in any case similar to those of a standard Sagnac loop fiber-optic interferometer. Only the noise is different from that of a Sagnac loop fiber-optic interferometer.

The calculations are directly applied to each modulation state (the states 1 to 12, for example) with the appropriate sign indicated in the first line of Table 2. The magneto-optic phase difference $\varphi_s$ is considered as being small and constant over a modulation period 1/Fp.

It follows that the power of the modulated/demodulated current is expressed as follows (in the absence of defect γ):

$$P_{demodulatedcurrent}(1/Fp) = \frac{A_0^2 \cdot \sin^2(2\theta)}{4} \cdot (8\sin(\alpha) + 4\sin(\alpha+\beta)) \cdot \sin(-4\cdot\varphi_S - \varphi_r) \quad \text{[Math 6]}$$

In closed loop, the control is made in such a way that:

$$\varphi_r = -4\cdot\varphi_S \quad \text{[Math. 7]}$$

where $\varphi_r$ represents the feedback provided by the modulator.

In the presence of a defect γ affecting the scaling factor, the interferometer response is modified. For example, a misalignment of the PM fiber 74 by an angle γ at the output of the differential phase modulator 16 is considered. In this case, the closed-loop control is made according to the following relation between $\varphi_r$ and $\varphi_s$.

$$\tan(\varphi_r) = \frac{\sin(\varphi_r)}{\cos(\varphi_r)} = -\frac{\sin(4\cdot\varphi_S)\cdot\cos(2\gamma)}{\cos(4\cdot\varphi_S)\cdot\left(\frac{1+\cos^2(2\gamma).}{2}\right) - \frac{\sin^2(2\gamma)}{2}} \quad \text{[Math 8]}$$

If $\varphi_s$ is small and $\varphi_r$ is small (i.e. of the order of a few percent of 2Pi), the above expression is modified as follows $$\varphi_r = \frac{4\cdot\varphi_S}{\cos(2\gamma)} \quad \text{[Math 9]}$$

Result of the Demodulation of the Modulated Power in Current Closed Loop

The calculations are directly applied for each of the 12 modulation states with the appropriate sign indicated at the 3rd line of Table 2.

In the absence of defect γ, the current closed-loop modulated/demodulated power is written as follows:

$$P_{modulateddemodulatedpower}(1/F_P) = \frac{A_0^2\cdot\sin^2(2\theta)}{4}\cdot\left(4\cdot\sin\left(\alpha+\frac{\beta}{2}\right)\cdot\sin\left(\frac{\beta}{2}\right)\right) \quad \text{[Math 10]}$$

In the presence of a defect γ, affecting the scaling factor, the current closed-loop modulated/demodulated power is modified and written as follows:

$$P_{modulateddemodulatedpower}(1/F_P) = \frac{A_0^2\cdot\sin^2(2\theta)}{4}\cdot\left(4\cdot\sin\left(\alpha+\frac{\beta}{2}\right)\cdot\sin\left(\frac{\beta}{2}\right)\right)\cdot\cos^2(2\gamma) \quad \text{[Math 11]}$$

It follows that the modulation amplitude Pmodulated=Pmax−Pmin is equal to the modulation amplitude in the absence of defect multiplied by $\cos^2(2\gamma)$.

If $\gamma$ is small and $\theta$ close to 45 degrees, and if $\varphi_s$ is small and $\varphi_r$ is small (i.e. of the order of a few percent of 2Pi), it is deduced therefrom:

$$\varphi_r = \frac{4\cdot\varphi_S}{\cos(2\gamma)}.$$

It can be deduced therefrom $4*\varphi_s$; which is $\varphi r*\cos(2\gamma)$.

The modulation and demodulation method enables to measure the defect $\gamma$ through the modulated power. Indeed, the scaling factor (FE) depends only on $\gamma$. The modulated power depends on $\beta$, $\alpha$, $A_0$, $\theta$, and on $\gamma$. Now $\beta$ and $\alpha$ are controlled by controlling the voltage Vpi. On the other hand, $A_0$ and $\theta$ relates to the total power that can be calculated.

It therefore possible to measure accurately and in real time the coefficient $\gamma$. This measurement enables to compensate in real time for the scaling factor error, at each measurement period.

Particularly advantageously, based on the real time measurement of the scaling factor defect, the interferometric system is adapted to compensate for or to correct the variations of the scaling factor as a function of time and in real time.

The scaling factor variations are for example due to misalignments of the fibers and of the quarter-wave plate that can vary in temperature.

Result of the Demodulation of Vpi in Current Closed Loop

The calculations are directly applied for each of the 12 modulation states with the appropriate sign indicated in the 2nd line of Table 2 by creating an error of Vpi, for example for state 1: $\pi-\alpha$ becomes $(\pi-\alpha)\cdot(1+\varepsilon)$ with $\varepsilon$ small and so on for each of the other states.

In the absence of defect $\gamma$, the demodulated power $V\pi$ is written as follows:

$$P_{Vpi\ demodulated}(1/F_P) = \frac{A_0^2\cdot\sin^2(2\theta)}{4}\cdot(4\cdot\sin(\alpha)\cdot\sin(\varepsilon\pi)) \quad \text{[Math 12]}$$

In the presence of a defect $\gamma$ affecting the scaling factor, and if $\varphi_s$ is small and $\varphi_r$ is small (i.e. of the order of a few percent of 2Pi), the above expression is modified and written as follows:

$$P_{Vpi\ demodulated}(1/Fp) = \frac{A_0^2\cdot\sin^2(2\theta)}{4}\cdot(4\cdot\sin(\alpha)\cdot\sin(\varepsilon\pi))\cdot\cos^2(2\gamma) \quad \text{[Math 13]}$$

When the interferometer is closed-loop controlled by the voltage Vpi, the voltage Vpi is adjusted so that $P_{vpi\ demodulated}$ is zero and thus that $\varepsilon$ is zero. The parameters $\alpha$ and $\beta$ are thus controlled by this parameter because the power of the voltage Vpi is calculated in real time at each modulation period, every 1/Fp. Now, the control of Vpi enables to know accurately the values of $\alpha$ and $\beta$.

Result of the Demodulation of the Mean Power (++++) in Closed Loop

The mean power is demodulated by applying to the 12 modulation states the appropriate signs indicated in the $4^{th}$ line of Table 2.

In the absence of defect $\gamma$, the demodulated mean power is expressed as follows:

$$P_{mean\ demodulated}(1/F_P) = \frac{A_0^2\cdot\sin^2(2\theta)}{4}\cdot(12-(8\cos(\alpha)+4\cos(\alpha+\beta))) \quad \text{[Math 14]}$$

In the presence of a defect $\gamma$, affecting the scaling factor, the expression of the mean power is modified and written as follows:

$$P_{mean\ demodulated}(1/F_P) = \frac{A_0^2\cdot\sin^2(2\theta)}{4}\cdot(8\cos(\alpha)+4\cos(\alpha+\beta))\cdot\frac{\sin(4\cdot\varphi_S)}{\sin(\varphi_r)}\cdot\cos^2(2\gamma)) + 3\cdot A_0^2(\sin^2(2\theta)+\cos^2(2\theta)\cdot\sin^2(2\gamma)\cdot(1+\cos(4\cdot\varphi_S)))) \quad \text{[Math 15]}$$

It is assumed here that the defect $\gamma$ has been determined from the modulation of the modulated power, as indicated in the paragraph: result of demodulation of the modulated power in current closed-loop. The demodulation of the mean power enables for example to determine the variations of the power of the source $A_0$ as a function of time and of $\theta$.

The above calculations are applied to a 12-state modulation for a faultless current sensor and for a coupling defect of the offset PM fiber on the differential phase modulator. The person skilled in the art will appreciate that similar calculations also apply to the defects of the quarter-wave plate, or to a birefringence defect, or to any other interferometer defect.

The method described above can also be used to derive a measurement of the temperature of the optical retarder 42, for example a quarter-wave plate.

Indeed, the voltage Vpi is a good measurement of the temperature at the integrated optical circuit 34, that thus makes it possible to control the temperature of the integrated optical circuit 34 and of the electric casing 35.

For that purpose, the quarter-wave plate is voluntarily offset to create a significant defect $\gamma$ but still small, of between 0.1% and a few %, for example 5%. A variation of the temperature at the quarter-wave plate causes a variation of $\gamma$. Particularly advantageously, the quarter-wave plate is offset enough to make the evolution monotonous and linear as a function of temperature variations, which can thus be easily measured.

The measurement of the variations of $\gamma$ gives information about the temperature at the quarter-wave plate. By learning and calibrating, it is therefore possible to compensate for faults and even variations in the Verdet constant of the detection optical fiber 73.

Of course, various other modifications can be made to the invention within the scope of the appended claims.

The invention claimed is:

1. A fiber-optic interferometer comprising:

a light source configured to generate a source beam;

a differential phase modulator;

a fiber-optic device comprising a detection optical fiber having a Verdet constant capable of inducing a non-reciprocal magneto-optic Faraday effect, the detection optical fiber being disposed in a magnetic field or forming at least one turn around an electric conductor;

a detection system; and a digital electronic signal-processing system, wherein the fiber-optic interferometer is configured to detect a phase difference of an interferometric beam formed by interferences between two polarized light waves travelled having simultaneously through the detection optical fiber along a closed optical path, the two polarized light waves being modulated by the differential phase modulator, and to deduce therefrom, by dividing the phase difference by a scaling factor, a value of the magnetic field integrated along the closed optical path or a value of an electric current flowing in the electric conductor, the scaling factor being proportional to the Verdet constant of the optical fiber, the digital electronic signal-processing system is configured to measure a variation of power contrast of part of the interferometric beam modulated by the differential phase modulator, deduce/from the contrast variation, a measurement of variation of the scaling factor, and correct, in real time, the scaling factor as a function of the measurement of variation of the scaling factor, and the fiber-optic interferometer is one of:

(i) a reflection interferometer, the digital electronic signal-processing system being configured to measure a power minimum of the part of the detected modulated interferometric beam, the minimum detected power $P_{min}$ being proportional to $\sin^2(2\gamma)$, and deduce, from the power minimum, the measurement of variation of the scaling factor, the scaling factor being proportional to $4VN/\cos(2\gamma)$ where $\gamma$ represents an angle of defect impacting the scaling factor, and (ii) a Sagnac interferometer, the digital electronic signal-processing system being configured to measure a difference between a power maximum and a power minimum of the part of the detected modulated interferometric beam, the difference between the power maximum and the power minimum being proportional to $\cos^2(2\gamma)$, and deduce, from the difference between the power maximum and the power minimum, the measurement of variation of the scaling factor, the scaling factor being proportional to $2VN/\cos(2\gamma)$, where $\gamma$ represents the angle of the defect impacting the scaling factor.

2. The fiber-optic interferometer according to claim 1, wherein the detection optical fiber is a circular polarization-maintaining optical fiber, the fiber-optic device comprises an optical phase retarder and a reflector, the optical phase retarder being disposed at one end of the detection optical fiber, the reflector being disposed at another end of the detection optical fiber, and the fiber-optic interferometer is configured such that the two polarized light waves travel back and forth through the detection optical fiber, with two orthogonal states of circular polarization, which are reversed by reflection on the reflector.

3. The fiber-optic interferometer according to claim 2, wherein the differential phase modulator is an electro-optical birefringence modulator that comprises a single waveguide configured to guide two orthogonal states of linear polarizations along two perpendicular axes, and the fiber-optic interferometer further comprises a polarizer disposed between the light source and the electro-optical birefringence modulator, the polarizer being oriented at 45 degrees with respect to the axes of the electro-optical birefringence modulator, one end of the electro-optical birefringence modulator being connected to the fiber-optic device.

4. The fiber-optic interferometer according to claim 2, further comprising a Y-junction separator disposed between the light source and the differential phase modulator, wherein the differential phase modulator comprises two waveguides configured to guide two beams of a same linear polarization and each having a phase modulator, and wherein the fiber-optic device includes a polarization-maintaining optical fiber section and another polarization-maintaining optical fiber section, the polarization-maintaining optical fiber section and, respectively, the other polarization-maintaining optical fiber section being each connected to one of the two waveguides of the differential phase modulator and a polarization coupler-splitter, the other polarization-maintaining optical fiber section being oriented to rotate a linear polarization by 90 degrees.

5. The fiber-optic interferometer according to claim 1, wherein the detection optical fiber is of a circular polarization-maintaining optical fiber, wherein the fiber-optic device comprises a Y-junction separator disposed between the light source and the differential phase modulator, wherein the differential phase modulator comprises two waveguides configured to guide two beams of same linear polarization, and wherein the fiber-optic device includes a polarization-maintaining optical fiber section, an optical phase retarder, another polarization-maintaining optical fiber section, and another optical phase retarder, the optical fiber section and, respectively, the other optical fiber section each being connected to one of the two waveguides of the differential phase modulator, and to the respective optical phase retarder or the other respective optical phase retarder, the optical phase retarder being disposed at one end of the detection optical fiber and the other optical phase retarder being disposed at another end of the detection optical fiber, the interferometer being configured such that the two polarized light waves travel through the detection optical fiber in opposite directions with a same circular polarization state.

6. The fiber-optic interferometer according to claim 2, wherein one or more of the optical phase retarder, and/or respectively the and another optical phase retarder respectively form a quarter-wave plate at the wavelength of the source beam.

7. The fiber-optic interferometer according to claim 6, wherein one or more of the optical phase retarder the other optical phase retarder is respectively offset to introduce a defect, and wherein the digital electronic signal-processing system is configured to extract, from the detected interferometric signal, a measurement of variation of the scaling factor of the system and deduce therefrom a respective temperature variation of one or more of the optical phase retarder and the other optical phase retarder.

8. The fiber-optic interferometer according to claim 3, wherein one or more of the optical phase retarder and another optical phase retarder respectively form a quarter-wave plate at the wavelength of the source beam.

9. The fiber-optic interferometer according to claim 4, wherein one or more of the optical phase retarder and another optical phase retarder respectively form a quarter-wave plate at the wavelength of the source beam.

10. The fiber-optic interferometer according to claim 5, wherein one or more of the optical phase retarder and another optical phase retarder respectively form a quarter-wave plate at the wavelength of the source beam.

11. A method for measuring a magnetic field or an electric current based on the fiber-optic interferometer according to claim 1, the method comprising:

emitting the source beam from the light source;

splitting the source beam into the two polarized light waves;

performing differential phase modulation of the two polarized light waves;

transmitting the two polarized light waves to the fiber-optic device comprising the detection optical fiber so that the two polarized light waves travel simultaneously through the optical fiber along the closed optical path, the detection optical fiber having the Verdet constant capable of inducing the non-reciprocal magneto-optic Faraday effect, the detection optical fiber being disposed in the magnetic field or forming the at least one turn about the electric conductor;

recombining the two polarized light waves at the output of the fiber-optic device to form the interferometric beam;

detecting the interferometric beam; and digital processing the detected signal to extract a measurement of a phase difference of the interferometric beam and to deduce, by dividing the phase difference by the scaling factor, the value of the magnetic field integrated along the closed optical path or the value of the electric current flowing in the electric conductor, wherein the digital signal processing is configured to measure the variation of power contrast of the part of the interferometric beam modulated by the differential phase modulator, deduce, from the contrast variation, the measurement of variation of the scaling factor, and correct in real time the scaling factor as the function of the measurement of the variation of the scaling factor, and wherein the fiber-optic interferometer is one of:

(i) the reflection interferometer, the digital electronic signal-processing system being configured to measure the power minimum of the part of the detected modulated interferometric beam, the minimum detected power $P_{min}$ being proportional to $\sin^2(2\gamma)$, and deduce, from the power minimum, the measurement of variation of the scaling factor, the scaling factor being proportional to $4VN/\cos(2\gamma)$ where $\gamma$ represents the angle of defect impacting the scaling factor, and (ii) the Sagnac interferometer, the digital electronic signal-processing system being configured to measure the difference between the power maximum and the power minimum of the part of the detected modulated interferometric beam, the difference between the power maximum and the power minimum being proportional to $\cos^2(2\gamma)$, and deduce, from the difference between the power maximum and the power minimum, the measurement of variation of the scaling factor, the scaling factor being proportional to $2VN/\cos(2\gamma)$, where $\gamma$ represents the angle of the defect impacting the scaling factor.

* * * * *